United States Patent
Szabo

(10) Patent No.: US 6,380,726 B1
(45) Date of Patent: *Apr. 30, 2002

(54) SMART AUTO-RANGING RMS MEASUREMENT METHOD AND APPARATUS

(75) Inventor: Paul I. Szabo, Seattle, WA (US)

(73) Assignee: Tektronix, Inc., Beaverton, OR (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/075,387

(22) Filed: May 8, 1998

(51) Int. Cl.[7] .................. G01R 15/00; G01R 17/06; G01R 13/20; G01R 19/14
(52) U.S. Cl. ............... 324/115; 324/99 D; 324/121 R; 324/133
(58) Field of Search ................ 324/115, 96, 132, 324/99 D, 131, 133, 121 R

(56) References Cited

U.S. PATENT DOCUMENTS

| | | | | |
|---|---|---|---|---|
| 3,958,178 A | * | 5/1976 | Mueller et al. | 324/115 |
| 4,096,434 A | * | 6/1978 | Meyer | 324/115 |
| 4,200,933 A | * | 4/1980 | Nickel et al. | 324/132 |
| 4,337,517 A | * | 6/1982 | Nickel et al. | 324/99 D |
| 4,520,310 A | * | 5/1985 | Kelly et al. | 324/115 |
| 4,633,221 A | * | 12/1986 | Bradshaw et al. | 324/99 D |
| 4,876,654 A | * | 10/1989 | Herscher | 324/76.19 |
| 5,117,180 A | * | 5/1992 | Swerlein | 324/130 |
| 5,144,226 A | * | 9/1992 | Rapp | 324/115 |
| 5,283,517 A | * | 2/1994 | Havel | 324/115 |
| 5,319,305 A | * | 6/1994 | Baba | 324/115 |
| 5,475,300 A | * | 12/1995 | Havel | 324/115 |

FOREIGN PATENT DOCUMENTS

| | | |
|---|---|---|
| JP | 63036155 | 3/1993 |
| JP | 09015266 | 1/1997 |
| JP | 09159699 | 6/1997 |
| JP | 2000002721 A * | 1/2000 |
| WO | WO 92/21037 | 11/1992 |

* cited by examiner

Primary Examiner—Safet Metjahic
Assistant Examiner—Jermele M. Hollington
(74) Attorney, Agent, or Firm—Thomas F. Lenihan; William K. Bucher

(57) ABSTRACT

An apparatus and method for performing an auto-ranging function in electronics test equipment monitors both the RMS value and the peak value of the input signal to be measured. In the subject system, a peak signal measurement which exceeds the dynamic range of the currently-selected range will cause selection of the next higher range. A peak signal measurement which would exceed the dynamic range of the next lower measurement range, will prevent selection of the next lower range when the RMS value would otherwise have caused that selection. A peak signal value which does not exceed the dynamic range of the currently-selected measurement range, or the dynamic range of the next lower measurement range will allow control of measurement range selection to be determined by the RMS value of the input signal.

11 Claims, 2 Drawing Sheets

SMART AUTO-RANGING RMS MEASUREMENT METHOD AND APPARATUS

FIELD OF THE INVENTION

The subject invention concerns the field of RMS signal measurement in general, and specifically concerns a smart autoranging RMS measurement method and the apparatus to implement it.

BACKGROUND OF THE INVENTION

Modern digital multimeters (DMMs) have the capability to measure the RMS (Root Mean Square) value of an AC signal. This capability is known variously as "True RMS" or "AC RMS" or "AC+DC RMS".

Various different scales (i.e., ranges) are used on DMMs to measure signals of different amplitudes. For example, a DMM may have 500 mv, 5 v, 50 v, and 500 v ranges. Auto-ranging features which decide which range to select, based on the input signal, are well-known in the art. For example, a 35 v input signal would result in the selection of the 50 v range from the list of exemplary ranges given above.

It is important that the algorithm which is used to decide the correct range incorporate some form of hysteresis to prevent oscillation between two ranges. When making an auto-ranging decision in order to measure an AC signal, one must use the RMS value of the signal, as a guide. As noted above an input signal having a 35 v RMS value would auto-range to the 50 v range, regardless of other characteristics of the signal, such as peak amplitude.

A typical RMS-only auto-ranging algorithm would control the DMM to change to the next higher range for values of input signal exceeding 100% of the currently-selected range, and control the DMM to change to the next lower range for values of input signal smaller than 8% of the full scale value of the currently selected range. This algorithm provides a 2% hysteresis band, assuming that the ratio of the two adjacent ranges is 10:1.

Unfortunately, a DMM employing the auto-ranging algorithm described above may be ranged incorrectly, causing an incorrect reading to be displayed. It is herein recognized that this problem occurs when a signal is being measured which has large peaks, in comparison to its RMS value. A signal of this kind is said to exhibit a large crest factor. The large peaks may overdrive the analog conditioning circuits, or drive the analog to digital (A-to-D) converter beyond its limits (sometimes referred to as "railing" the A-to-D). For example, a 35 v RMS signal exhibiting a crest factor of 6 would have peaks (i.e., maximum signal excursions) of substantially 210 v. Such a condition greatly exceeds the dynamic range of the 50 v range of the DMM. As noted above, the typical auto-ranging algorithm would, nevertheless, cause the DMM to select the 50 v range, the measurement would be incorrect, and the user would not know it.

SUMMARY OF THE INVENTION

An apparatus and method for performing an auto-ranging function in electronics test equipment monitors both the RMS value and the peak value of the input signal to be measured. In the subject system, a peak signal measurement which exceeds the dynamic range of the currently-selected range will cause selection of the next higher range. A peak signal measurement which would exceed the dynamic range of the next lower measurement range, will prevent selection of the next lower range when the RMS value would otherwise have caused that selection. A peak signal value which does not exceed the dynamic range of the currently-selected measurement range, or the dynamic range of the next lower measurement range will allow control of measurement range selection to be determined by the RMS value of the input signal.

DETAILED DESCRIPTION OF THE INVENTION

Figure 1:
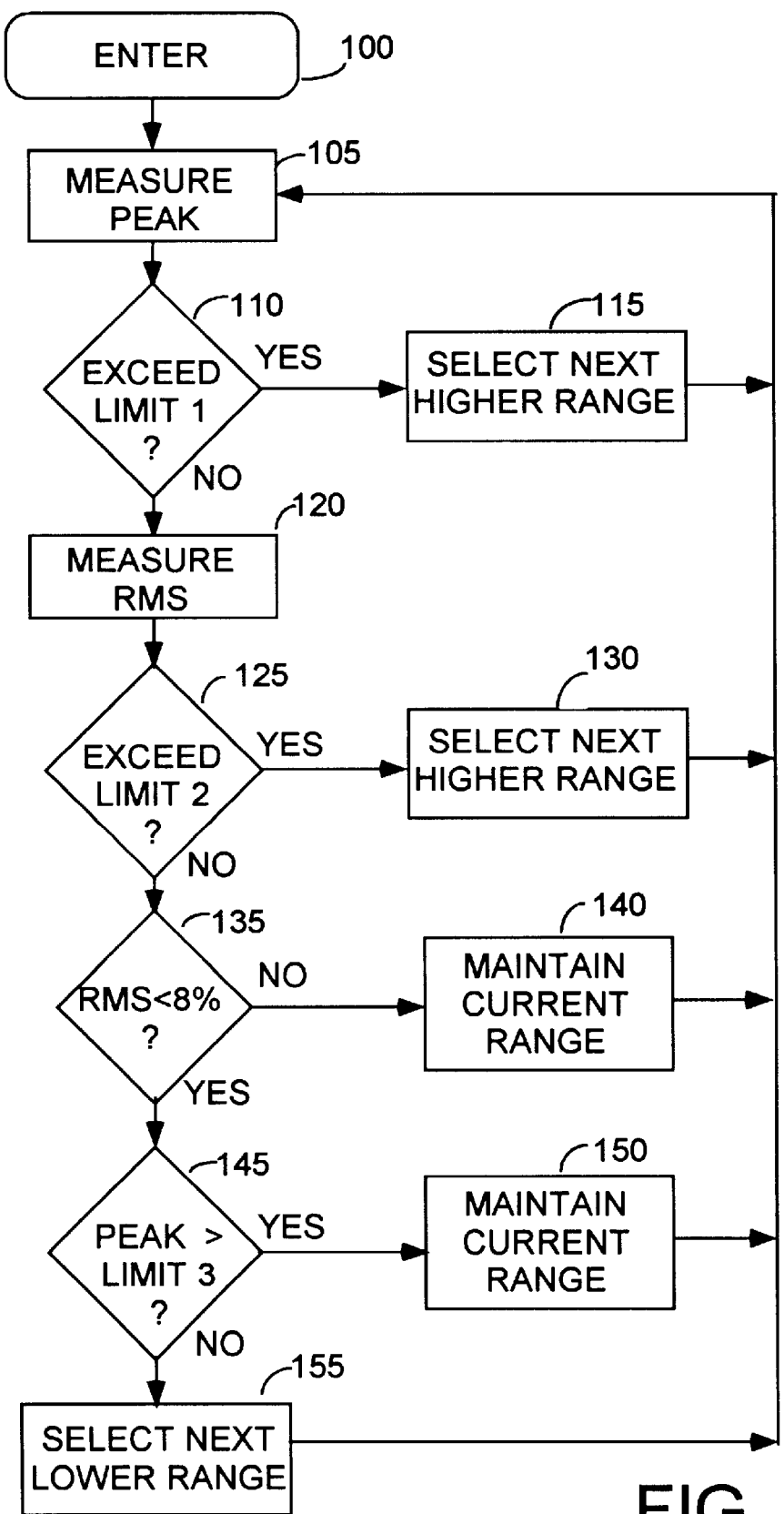
FIG. 1 shows a flowchart of useful for understanding the invention.

Referring to FIG. 1, a software routine is entered at step 100. At step 105 the peak measurement circuitry is read. At step 110 a determination is made as to whether or not LIMIT 1 has been exceeded. Limit 1 is a value representing the dynamic range of the currently selected range of the measurement system. In a system exhibiting a Crest Factor of 3, the dynamic range would be 150 v on the 50 v range. Thus, in such a system, operating on the 5 v range, LIMIT 1 would be equal to 150 v, and a peak value of the input signal exceeding 150 v causes the controller to exit step 110 along the YES path to step 115 wherein the next higher band is immediately selected. Note that because a fast peak measurement is used, rather than a slow RMS measurement, the DMM autoranges upward (also called up-ranging) much faster than in prior art DMMs.

If, at step 110, LIMIT 1 was not exceeded, then the controller would follow the NO path to step 120 wherein the RMS value of the input signal is measured. The controller proceeds to step 125 wherein it is determined whether or not LIMIT 2 has been exceeded. Limit 2 is equal to 100% of the full scale reading of the current range. Thus, on the 50 v range, LIMIT 2 is equal to 50 v. If the RMS value of the input signal exceeds LIMIT 2 (50 v) then the controller exits step 125 along the YES path to step 130 wherein the next higher range is selected.

If, at step 125, LIMIT 2 was not exceeded, then a check is made to see if the RMS value of the input signal is less than 8% of the full range of the currently selected range. In this case, 8% of 50 v equals 4 v. If the RMS value is greater than or equal to 4 v, then the controller exits step 135 along the NO path to step 140 wherein the current range is maintained.

If, at step 125 the RMS value of the input signal is less than 4 v, then the controller exits step 135 along the YES path to step 145. A signal exhibiting an RMS value which is less than 8% of the current range should be measured and displayed on a lower range. However, it is herein recognized that one may not want to select the next lower range (i.e., "down-range"), if the input signal has a crest factor which would cause it to give erroneous readings on the lower scale. Therefore, At step 145, a check is made to see if the peak measurement made at step 105 exceeds the dynamic range for the next lower measurement range before switching to it. An important advantage of the subject invention is that by not automatically downranging it conveys to the user the information that although a safe low reading is displayed, higher level (possibly dangerous) peaks are being detected. In this example, the next lower measurement range is 5 v, and has a corresponding dynamic range (crest factor handling capability) of 15 v. Thus, in order to switch downward, the input signal must have an RMS value less than 4 v and a peak value not exceeding 15 v. If the peak value is determined at step 145 to exceed LIMIT 3 (15 v) then the YES path is taken to step 150 and the currently selected range is maintained. If LIMIT 3 is not exceeded then the NO path is followed, and the next lower range is selected at step 155.

Figure 2:
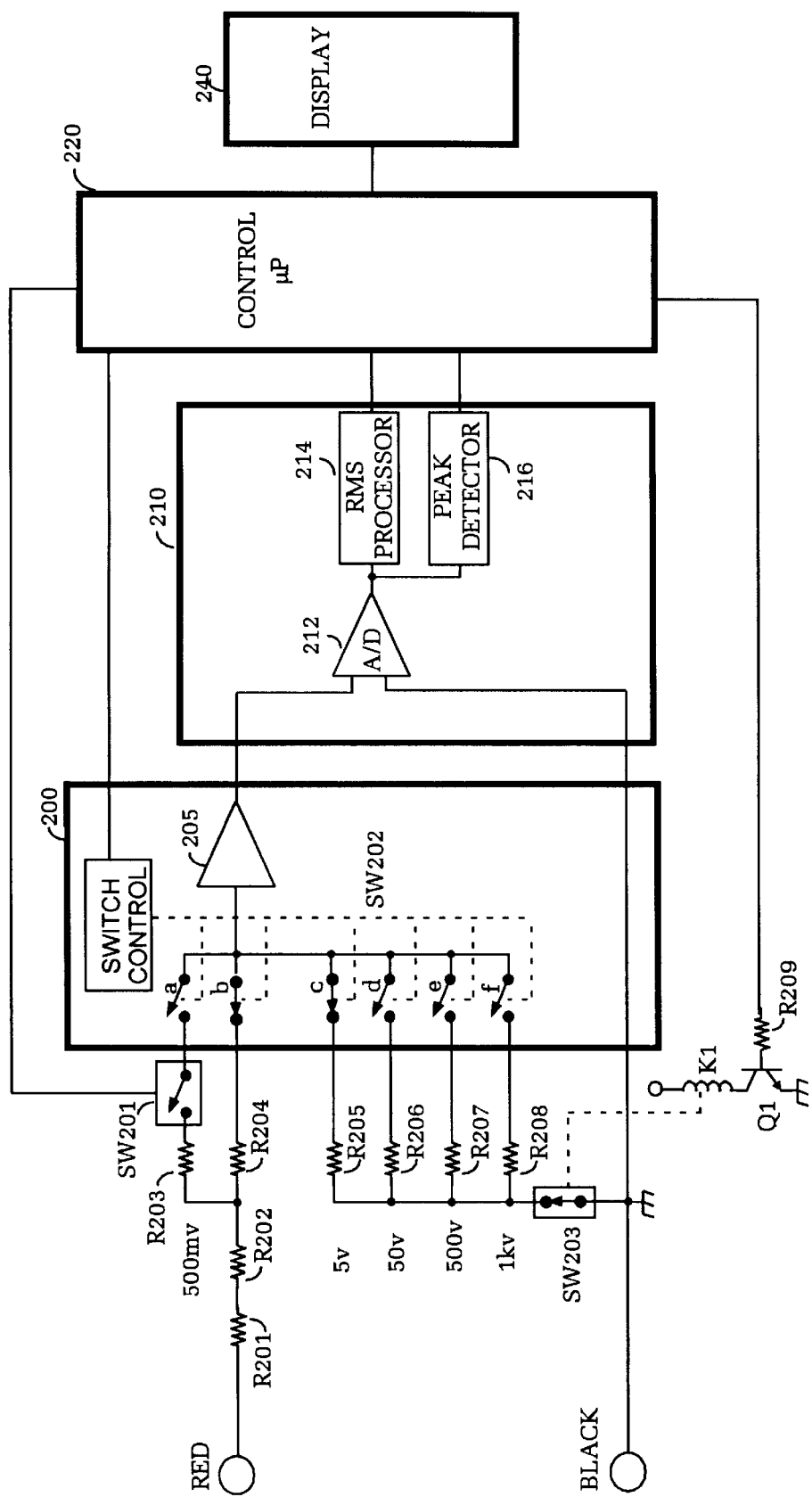
FIG. 2 shows a partial schematic of a multimeter useful for implementing the invention.

FIG. 2 shows, in block diagram form, a portion of the circuitry of a DMM suitable for practicing the invention. The DMM includes two connectors for receiving probes which are coupled to a circuit under test. The connector marked BLACK typically is connected to a ground or return point in a circuit, and the connector marked RED normally receives a signal to be measured with respect to the ground reference. The signal to be measured is coupled from the RED terminal via two series coupled resistors R201 and R202. R201 is a thermistor having a value of 1.5 kohms. R202 is a 2.7 kohm resistor.

The DMM illustrated in FIG. 2 has five voltage measurement ranges 500 mv, 5 v, 50 v, 500 v, and 1 Kv. The measurement ranges are selected by selective closing of switches SW201, SW202, and SW203. A switching integrated circuit (IC) 200 includes multi-pole switch SW202, controlled by a switch control unit in response to control signals from a control microprocessor 220. For the 500 mv range, SW201 is controlled by control microprocessor 220 to couple signal to switch SW202a which is closed (conductive) while all other segments of SW202 are open (non-conducting). In this condition, the input signal is conveyed via R201, R202, and R203 (having a value of 1 MegOhm) through SW201 and SW202a to the input of amplifier 205. For all other ranges, SW201 is open.

For the 5 v range, the signal is divided by a voltage divider formed essentially of R204 (having a value of 10 Megohms) and R205 (having a value of 1 Megohm). The additional series resistance of R201 and R202 is very small in comparison to resistances of the voltage divider resistors, and has little effect on the output voltage. R205 is coupled into the voltage divider circuit by the action of SW202b, SW202c, and the closed relay contacts SW203 of RELAY K1. Relay K1 operates in response to control signals from control microprocessor 220, applied via R209 to a driver transistor Q1. The exact relay driver configuration may be one of several known in the art and is not particularly important to the subject invention.

For the 50 v range, the signal is divided by a voltage divider formed essentially of R204 (having a value of 10 Megohms) and R206 (having a value of 100 kohm). R206 is coupled into the voltage divider circuit by the action of SW202b, SW202d, and the closed relay contacts SW203 of RELAY K1.

For the 500 v range, the signal is divided by a voltage divider formed essentially of R204 (having a value of 10 Megohms) and R207 (having a value of 10 kohm). R207 is coupled into the voltage divider circuit by the action of SW202b, SW202e, and the closed relay contacts SW203 of RELAY K1.

For the 1 Kv range, the signal is divided by a voltage divider formed essentially of R204 (having a value of 10 Megohms) and R208 (having a value of 1 kohm). R208 is coupled into the voltage divider circuit by the action of SW202b, SW202f, and the closed relay contacts SW203 of RELAY K1.

The signal from amplifier 205 is coupled to one input of an A/D converter circuit 212 which is included in a signal processing IC 210. The other input of A/D converter circuit 212 is coupled to the BLACK terminal. A/D converter circuit 212 converts the analog voltage received from amplifier 205 to a multibit digital signal and applies the multibit digital signal to an RMS Processor 214 and a Peak Detector 216. RMS processor 214 can be one of a number of circuits designed to extract the RMS value of an input signal. Similarly, the peak detector can be one of several peak detection circuits which are well-known in the art.

The output of RMS processor 214 and peak detector 216 are coupled to control microprocessor 220. Control microprocessor 220 processes the data and causes the measured value to be displayed on display 240, which may be for example an LCD display device.

In operation, when the peak detection data indicates that the crest factor of the signal is such that peaks within the signal being measured are exceeding the dynamic range of the selected range, control microprocessor 220 controls the above-described switching circuitry to select the next higher measurement range. Also, if value of the RMS data is equal to greater than the full scale of the currently selected measurement range, then control microprocessor 220 will control the above-described switching circuitry to select the next higher measurement range. It is also noted that the automatic up-ranging is accomplished faster because peak detector 216 operates more quickly than does the RMS processor 214.

In the down-ranging direction, control microprocessor 220 will cause the selection of the next lower range by controlling the switching arrangement described above, if the peak detector indicates that the dynamic range of the next lower measurement rang will not be exceeded by peaks in the signal being measured.

Advantageously, the auto-ranging decisions of the present invention are made for the peak values based not on what the full scale RMS value is, but rather on the dynamic range of the measurement system. For a system with a crest factor of 3, this would be 150 v in the 50 v measurement range. Hysteresis must be used to prevent oscillation between two ranges. For example, a decision may be made not to down-range based on the peak values, if the peak values are greater than 8% of the dynamic range of the system. The decision is made to up-range when the peak values are greater than 100% of the dynamic range of the system. This gives a hysteresis band of 2%. That is, 2%=((100%/10%)–8%). (Assuming that the ratio of the two measurement ranges is 10:1).

The hysteresis band for auto-ranging on the peak values must be chosen so that it does not interfere with normal down-ranging based on the RMS value of the signal. For example, if the down-ranging threshold for RMS is 8% of RMS full scale, such a signal with a crest factor of 3 would have peaks that are 24% of RMS fall scale. If the dynamic range is 300% of RMS full scale (crest factor specification is at most 3), then a do-not-down-range' threshold for peak values must be chosen that is a maximum of 30% RMS full scale (which becomes 300% in the lower range), minus some amount of hysteresis. It seems easiest to choose 24% of RMS full scale as the "do-not-down-range" threshold for peaks, because this gives the most hysteresis, without sacrificing resolution for signals with a crest factor less than the specification. In this example, when the down-range was accomplished, the peaks would be 240% of RMS full scale, and the RMS would be 80% of RMS full scale. The formula which gives maximum hysteresis without sacrificing measurement resolution is: max hysteresis peak threshold=RMS downrange threshold X crest factor specification Two errors can be made, a false positive on a decision not to down-range, or a false negative on a decision not to down-range. A false negative means that there is not enough hysteresis, and the instrument will oscillate between two adjacent measurement ranges. A false positive means that the instrument will not down-range when it could have, and the measurement will not have the resolution that it would have had in the lower range.

Any additional dynamic range beyond the specified crest factor gives additional hysteresis margin, or it could be used to help prevent false positive "do not downrange" decisions. A formula for choosing the "do not downrange threshold" that gives additional margin against false positive "do not downrange" decisions, but does not improve hysteresis, is:
false pos decision margin=RMS downrange threshold X Dynamic Range/full scale RMS The accuracy of the peak measurement device must be good enough that the difference (error) in peak measurements for two different ranges does not exceed the hysteresis band. Two sources of error are the bandwidth differences of the ranges, and the measurement resolution of the peak detectors. A hysteresis band greater than the measurement error is needed to prevent oscillation.

In practice, a number halfway between the maximum possible hysteresis, and the false positive decision margin is used, because oscillating between two adjacent measurement ranges is much worse behavior than not down-ranging for signals with crest factors around three.

While the term control microprocessor was used in the description, other forms of controller such as a microcomputer, or dedicated logic, or an ASIC can also be used. Thus the term controller is deemed to include all of the above.

While the invention has been described with respect to a digital multimeter, it is herein recognized that it would is also applicable to other types of test and measurement equipment, and such modification is deemed to lie within the scope of the following claims.

What is claimed is:
1. A digital multimeter, comprising:
    an input terminal for receiving an input signal to be measured;
    a controller for controlling measurement range switching;
    an RMS processor circuit receiving a signal representative of said input signal for providing a signal indicative of an RMS value of said input signal to said controller; and
    a peak detector circuit receiving a signal representative of said input signal for providing a peak signal indicative of peak amplitude of said input signal to said controller;
    switching circuitry for selecting a measurement range from a plurality of measurement ranges under control of said controller in response to a characteristic of said input signal being measured;
    said characteristic being one of said RMS value of said input signal and said peak amplitude;
    said controller causing said switching circuitry to select a measurement range in response to said peak signal amplitude exceeding a predetermined threshold; and
    in response to said peak signal amplitude not exceeding said predetermined threshold;
    said controller examines said signal indicative of said RMS value;
    said controller causing said switching circuitry to select a measurement range in response to said signal indicative of RMS value exceeding a predetermined value.

2. The digital multimeter of claim 1 wherein said RMS processor produces a multibit digital signal at said output.

3. The digital multimeter of claim 1 wherein said peak detector produces a multibit digital signal at said output.

4. A digital multimeter, comprising:
    an input terminal for receiving an input signal to be measured;
    a controller for controlling measurement range switching;
    an RMS processor circuit receiving a signal representative of said input signal for providing a signal indicative of an RMS value of said input signal to said controller; and
    a peak detector circuit receiving a signal representative of said input signal for providing a peak signal indicative of peak amplitude of said input signal to said controller;
    switching circuitry for selecting a measurement range from a plurality of measurement ranges under control of said controller in response to a characteristic of said input signal being measured;
    said characteristic being one of said RMS value of said input signal and said peak amplitude;
    said controller preventing said switching circuitry from selecting a next lower measurement range when said peak amplitude exceeds a predetermined threshold associated with said next lower measurement range and when said signal indicative of RMS value is below a predetermined limit associated with said next lower measurement range.

5. The digital multimeter of claim 4 wherein said RMS processor produces a multibit digital signal at said output.

6. The digital multimeter of claim 4 wherein said peak detector produces a multibit digital signal at said output.

7. A digital multimeter, comprising:
    an input terminal for receiving an input signal to be measured;
    a controller for controlling measurement range switching;
    an RMS processor circuit receiving a signal representative of said input signal for providing a signal indicative of an RMS value of said input signal to said controller; and
    a peak detector circuit receiving a signal representative of said input signal for providing a peak signal indicative of peak amplitude of said input signal to said controller;
    switching circuitry for selecting a measurement range from a plurality of measurement ranges under control of said controller in response to a characteristic of said input signal being measured;
    said characteristic being one of said RMS value of said input signal and said peak amplitude;
    said controller causing said switching circuitry to select a next higher measurement range in response to said peak signal amplitude exceeding a predetermined threshold; and
    in response to said peak signal amplitude not exceeding said predetermined threshold; said controller examines said signal indicative of said RMS value;
    said controller causing said switching circuitry to select a next higher measurement range in response to said signal indicative of RMS value exceeding a predetermined value;
    and
    said controller causing said switching circuitry to select a next lower measurement range when said RMS value is less than a predetermined RMS limit and with said peak signal amplitude does not exceed a predetermined threshold associated with said next lower measurement range.

8. The digital multimeter of claim 7 wherein said RMS processor produces a multibit digital signal at said output.

9. The digital multimeter of claim 7 wherein said peak detector produces a multibit digital signal at said output.

10. A method for controlling an autoranging function, comprising the steps of:

receiving an input signal to be measured;

selecting a measurement range from a plurality of measurement ranges in response to a characteristic of said input signal being measured;

providing an RMS processor for developing a signal indicative of the RMS value of said input signal said RMS value being a characteristic of said input signal; and providing a peak detector circuit for developing a peak signal representative of a peak amplitude of said input signal, said peak amplitude also being a characteristic of said input signal;

causing said switching circuitry to select a next higher measurement range of said plurality of ranges when said peak amplitude exceeds a predetermined limit; and causing said switching circuitry to select a next lower measurement range when said RMS value is less than a predetermined RMS limit value and when said peak amplitude does not exceed a predetermined peak value associated with said next lower measurement range.

11. A method for controlling an autoranging function, comprising the steps of:

receiving an input signal to be measured selecting a measurement range from a plurality of memory ranges in response to a characteristic of said input signal being measured;

providing an RMS processor for developing a signal indicative of the RMS value of said input signal, said RMS value being a characteristic of said input signal; and providing a peak detector circuit for developing a peak signal representative of a peak amplitude of said input signal, said peak amplitude also being a characteristic of said input signal;

causing said switching circuitry to select a next lower measurement range when said RMS value is less than a predetermined RMS limit value and when said peak amplitude does not exceed a predetermined peak value associated with said next lower measurement range.

* * * * *